(12) United States Patent
Mok et al.

(10) Patent No.: US 7,262,438 B2
(45) Date of Patent: Aug. 28, 2007

(54) LED MOUNTING HAVING INCREASED HEAT DISSIPATION

(75) Inventors: Thye Linn Mok, Bukit Mertajam (MY); Siew Kim Tan, Alor Setar (MY); Shin Wen Ng, Bukit Mertajam (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/075,094

(22) Filed: Mar. 8, 2005

(65) Prior Publication Data

US 2006/0202210 A1   Sep. 14, 2006

(51) Int. Cl.
*H01L 29/22* (2006.01)

(52) U.S. Cl. ............... 257/98; 257/676; 257/E33.066; 438/122

(58) Field of Classification Search ............ 438/25, 438/106, 107, 110, 112, 124, 126, 127, FOR. 157, 438/122; 257/79–103, 622, 623, 687, 701, 257/666–677, E33.066
See application file for complete search history.

(56) References Cited

U.S. PATENT DOCUMENTS

| | | | |
|---|---|---|---|
| 6,335,548 B1 * | 1/2002 | Roberts et al. ............... 257/98 |
| 6,480,389 B1 * | 11/2002 | Shie et al. ............... 361/707 |
| 2003/0168720 A1 * | 9/2003 | Kamada ............... 257/666 |
| 2003/0189830 A1 | 10/2003 | Sugimoto et al. |
| 2004/0079957 A1 * | 4/2004 | Andrews et al. ............ 257/100 |
| 2004/0264195 A1 | 12/2004 | Chang et al. |
| 2005/0023537 A1 | 2/2005 | Salam |
| 2005/0023538 A1 | 2/2005 | Ishii et al. |

FOREIGN PATENT DOCUMENTS

| | | |
|---|---|---|
| EP | 1 244 146 | 3/2002 |
| EP | 1 387 412 | 2/2004 |
| GB | 2 361 581 | 10/2001 |
| GB | 2 406 969 | 4/2005 |
| JP | 5-211374 | 8/1993 |
| JP | 2002-43632 | 2/2002 |

OTHER PUBLICATIONS

UK Search Report dated Jul. 4, 2006 involving counterpart UK application No. GB0604614.8.

\* cited by examiner

*Primary Examiner*—Brook Kebede

(57) ABSTRACT

There is disclosed a system and method for increasing heat dissipation of LED displays by using the current PCB packaging mounted to a LCD panel support structure thereby eliminating the need for a metal core PCB. In one embodiment, reverse mounted LEDs having heat dissipation pads are used to optimize heat transfer to a metal layer which is then placed in contact with the LCD support structure.

12 Claims, 5 Drawing Sheets

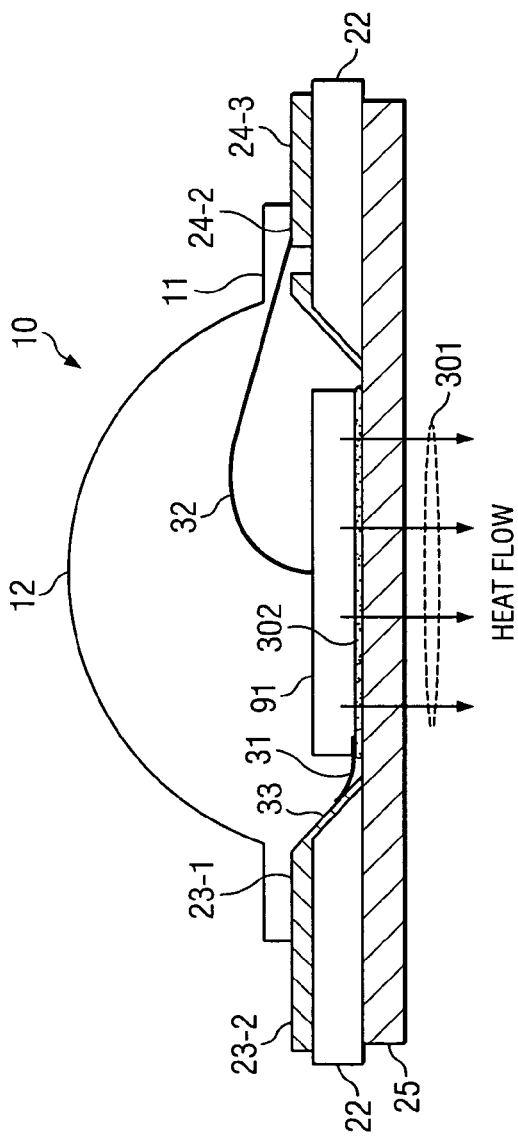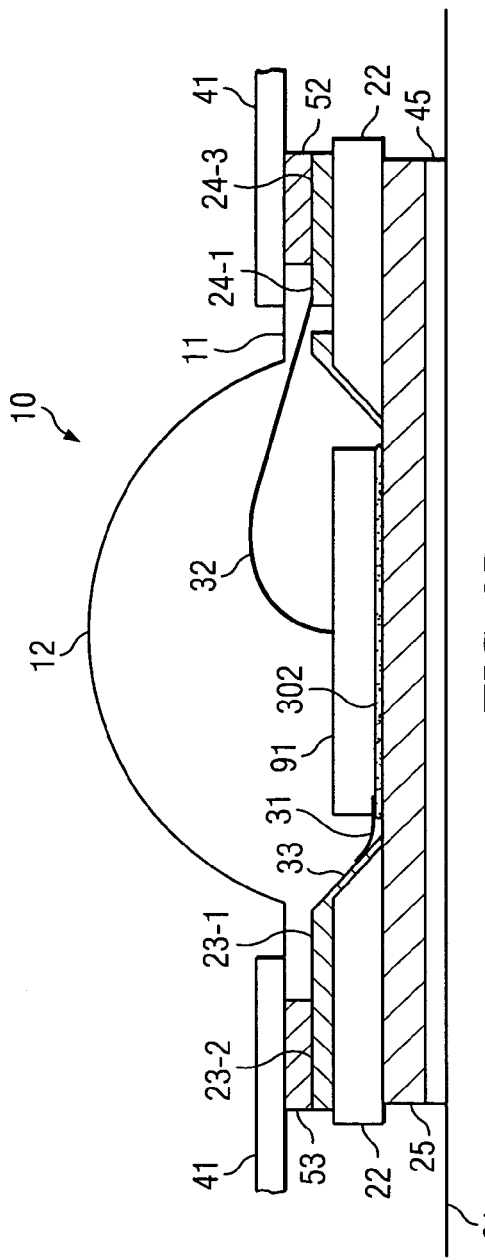

HORIZONTAL STRUCTURE

VERTICAL STRUCTURE

LED MOUNTING HAVING INCREASED HEAT DISSIPATION

BACKGROUND OF THE INVENTION

The need for LEDs having high power (increased brightness) is increasing. As power increases, so does the need for heat dissipation since if the heat generated by the LED junction is not dissipated effectively the brightness of the LED is diminished.

Currently LEDs are produced in surface-mounted LED packages which are mounted to aluminum metal core PCBs. The metal core PCBs act as direct heat-sinks drawing the heat away from the LEDs. Using metal core PCBs is relatively expensive since the cost of the material for a metal core PCB is high.

BRIEF SUMMARY OF THE INVENTION

There is disclosed a system and method for increasing heat dissipation of LED displays by using the current PCB packaging mounted to a LCD panel support structure thereby eliminating the need for a metal core PCB. In one embodiment, reverse mounted LEDs having heat dissipation pads are used to optimize heat transfer to a metal layer which is then placed in contact with the LCD support structure.

BRIEF DESCRIPTION OF THE DRAWINGS

For a more complete understanding of the present invention, reference is now made to the following descriptions taken in conjunction with the accompanying drawing, in which:

FIGS. 3A and 3B show embodiments of side views of the single LED package of FIG. 1 taken along section line 3A-3A of FIG. 2;

DETAILED DESCRIPTION OF THE INVENTION

Figure 1:
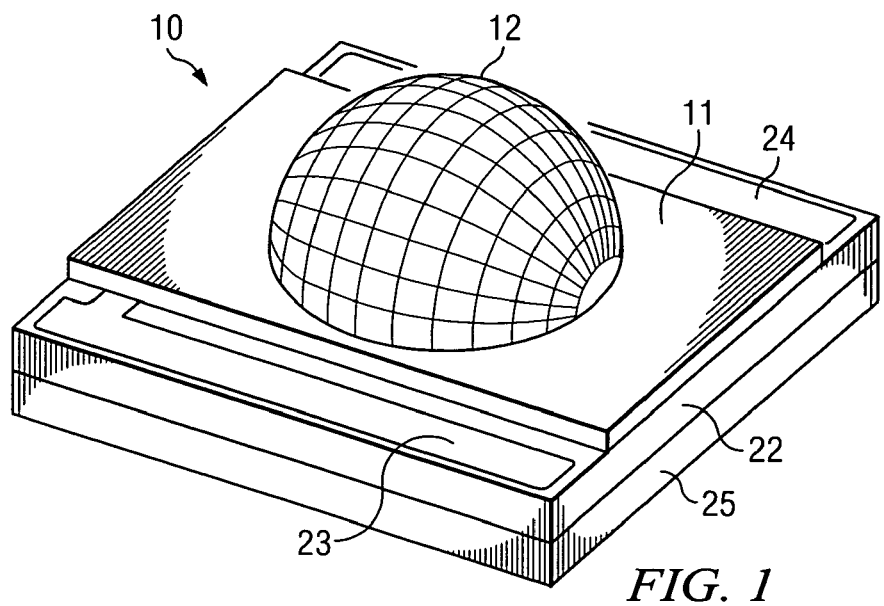
FIG. 1 shows a perspective view of one embodiment of a single LED and dome package.

FIG. 1 shows a perspective view of one embodiment of single LED package 10 consisting of PCB substrate 22 mated to heat-sink pad 25. Optical dome 12 is constructed, by molding or otherwise, above surface 11 which in turn is mated to substrate 22. Contact strips 23 and 24 are constructed on the surface of substrate 22 and are used as discussed in more detail hereinafter.

Figure 2:
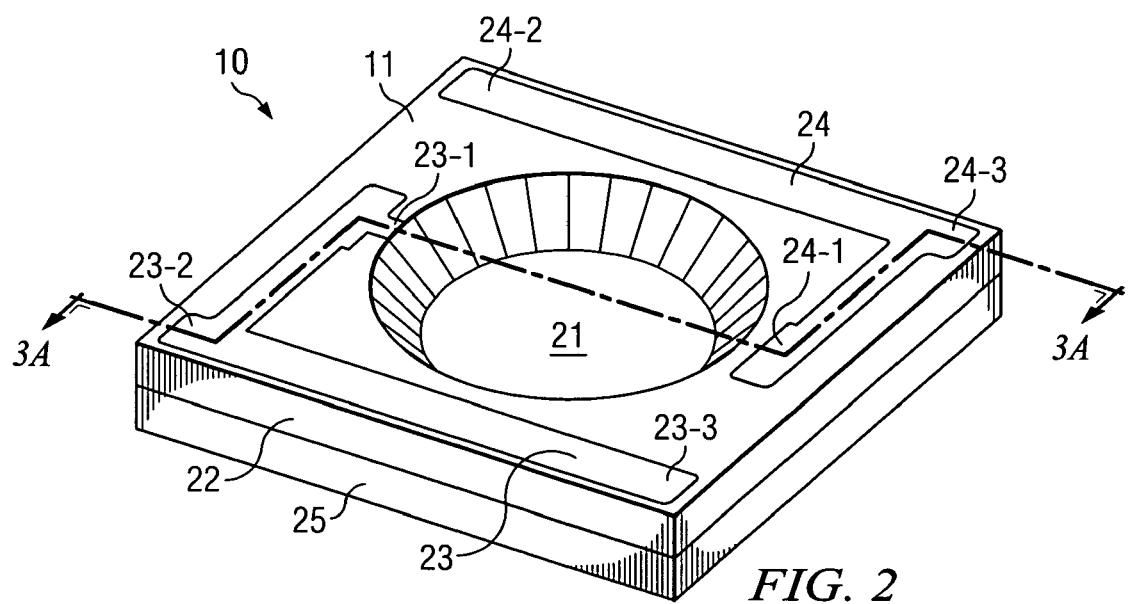
FIG. 2 shows one embodiment of the LED package of FIG. 1 with the LED removed.

FIG. 2 shows package 10 with the LED and optical dome 12 removed. An LED chip (or other light emitting source) would be physically attached to heat-sink pad 25 inside reflector cup 21 by a terminally conductive bonding agent, or by other fastener means. The LED would then be wire bond connected to pads 23-1 and 24-1 of contact strips 23 and 24, respectively, for subsequent connection to an external electrical path. The heat path from the LED is through heat-sink pad 25 which can be, for example, copper. Note that the heat path from the LED is pad 25 and is separate from the electrical path to optimize the heat dissipation from the die to the back structure. The LED is mounted to pad 25 using a thermally conductive (but non-electrically conductive) adhesive dielectric. The heat dissipation is better than in prior art metal core PCBs because the pad has a wider surface area.

Reflector cup 21 is constructed having an optimum angle for reflecting LED side light to the top of the package. The reflector cup is formed, for example, using bright color opaque material. Once the LED is mated with pad 25, transparent material is poured around the LED to encapsulate the LED and wire bond to form complete LED package 10.

Optical dome 12 (FIG. 1) is constructed to direct the light from the LED source in a desired direction. The light output of the LED can be changed, as desired, to applications simply by redesigning the dome shape.

FIG. 3A shows a sectional cut-away side view of LED package 10 taken along section line 3A-3A of FIG. 2 having light source, such as LED 31, physically bonded to heat dissipation pad 25 by bonding material 302. Bond wire 32 connects one terminal of LED 31 to contact pad 24-1 of contact strip 24 (FIG. 1). The second electrical terminal of LED 31 is connected to contact pad 23-1 by path 33. Any electrical contact system can be used to connect LED 31 to respective contacts external to dome 12. In the embodiment shown, there are two such leads but there could be three or more, if desired.

Figure 4:
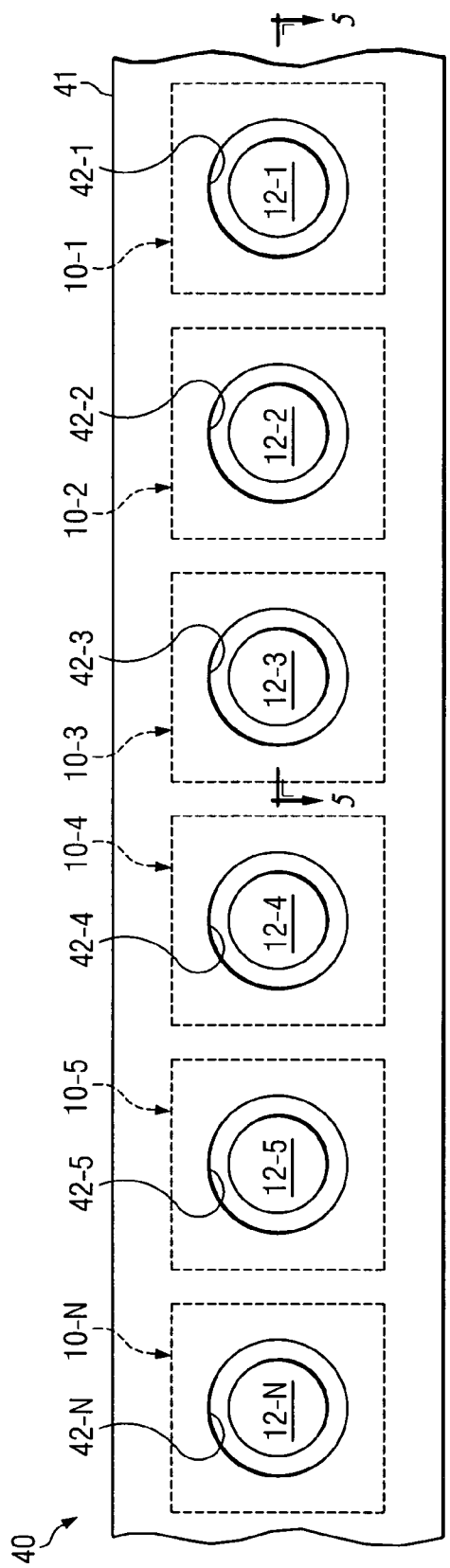
FIGS. 4 and 5 show top and side views, respectively, of a multiple LED package.

FIG. 3B shows in a cut-away view how external power is connected via contacts 52 and 53 to contact area 23-2 and 24-2. The position of contact areas 23-1, 23-2, 24-1, and 24-2 is shown in FIG. 2. Note that these contacts can be any place along contact strip 23, 24 so long as they do not interfere with the wire bonds to the LED. FIG. 4 shows display 40 having a plurality of LED packages 10-1 through 10-N, each with an LED 12-1 to 12-N. Surrounding each LED package is a opening, such as opening 42-1 through 42-N formed in structure 42 to allow light from the respective LED to pass through.

Figure 5:
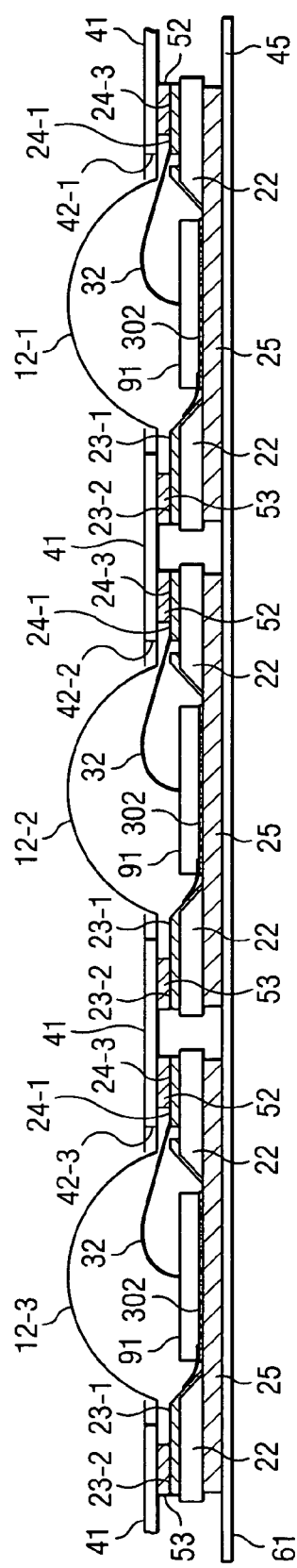

FIG. 5 is a cross-section of display 40 taken a long line 5-5 of FIG. 4 showing three LEDs 12-1, 12-2, 12-3 mounted to mounting plate 61. (Mounting plate 61 will be described more fully with respect to FIG. 6.) Shown in FIG. 5 are contacts 52 and 53 which are formed beneath the surface of structure 41 for the purpose of providing control and power to the respective LEDs. This then allows for the contact surface to be on the top side of the LED device and away from heat pad 25 for better electrical and heat separation.

Figure 6:
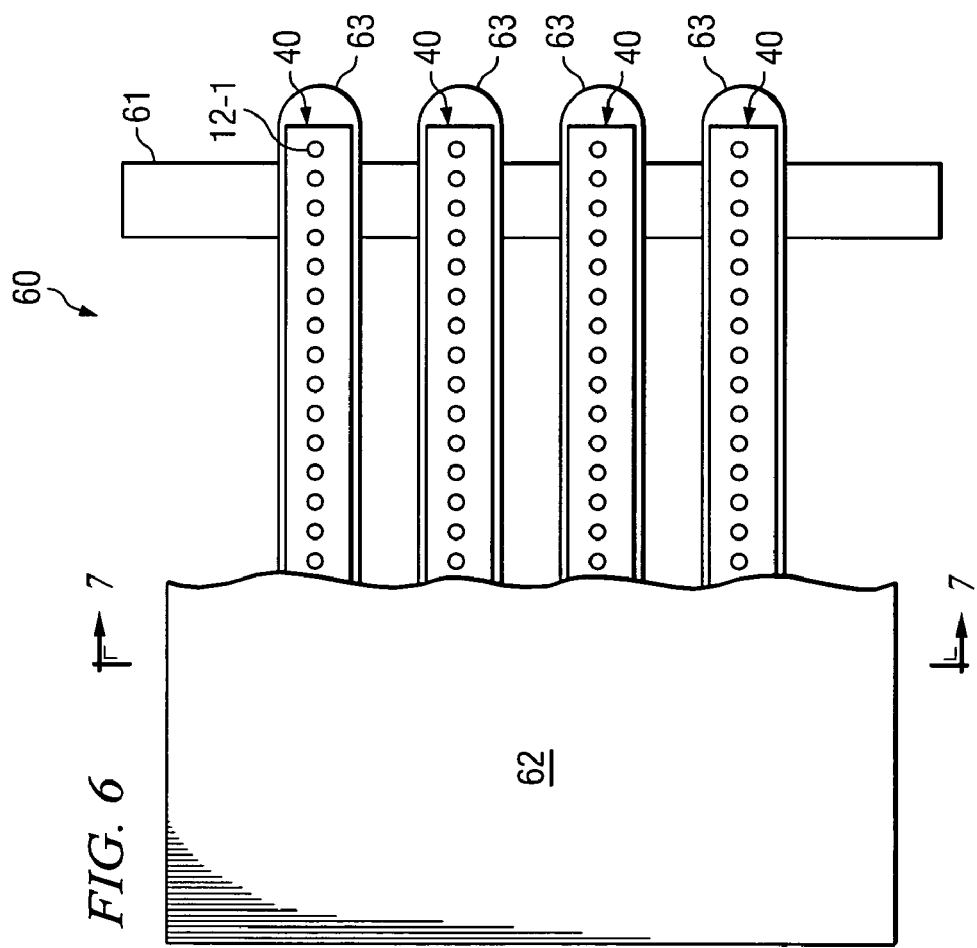

FIG. 6 shows system 60 which has a plurality of LED strips 40 mounted to heat dissipation bar 63 which in turn is connected to back mounting plate 61. If desired, cover 62 can be added. Cover 62 could have opaque areas for allowing the LED light to be seen externally.

Figure 7:
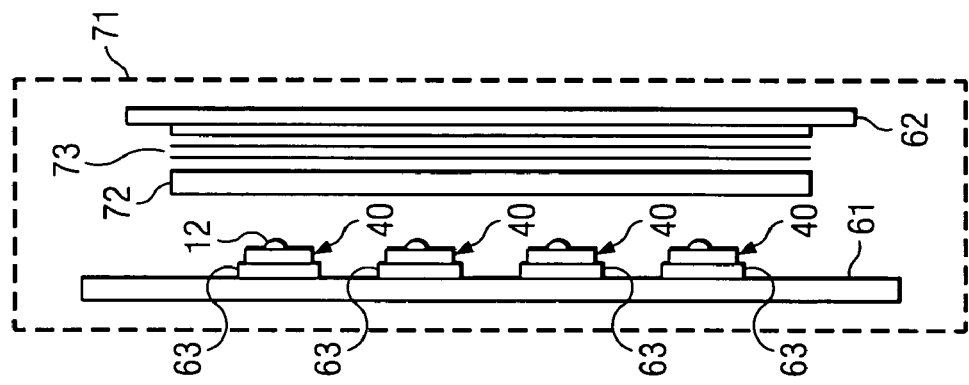
FIGS. 6 and 7 show a display using LED strips constructed in accordance with the teachings of this disclosure.

FIG. 7 shows a cross-section of structure 60 taken along section line 7-7 of FIG. 6. In FIG. 7 light diffusers and other elements 72, 73 are shown for diffusing, or otherwise controlling the light. Such control can be on an individual basis, if desired.

Figure 8:
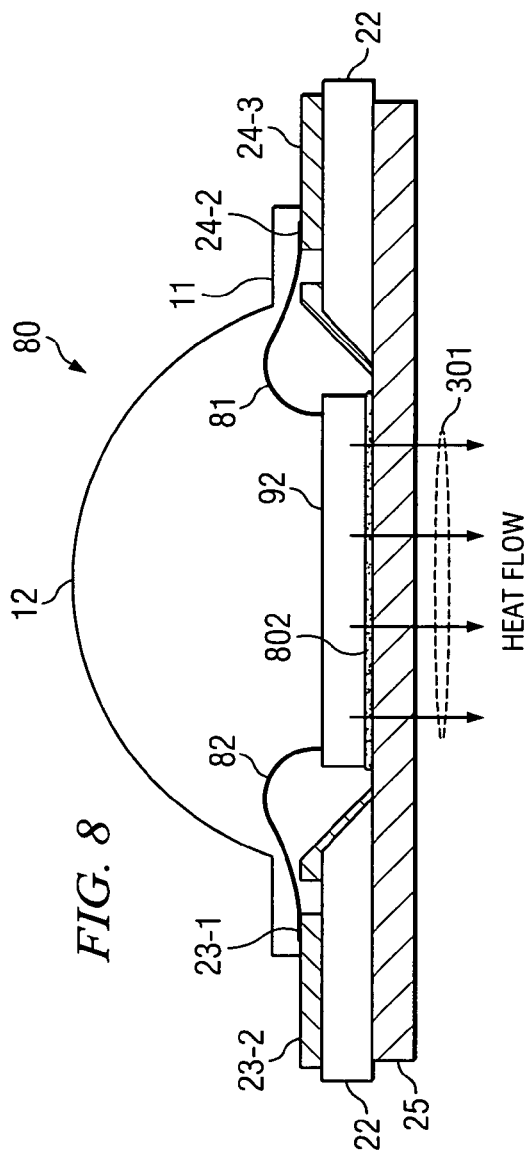
Figure 9B:
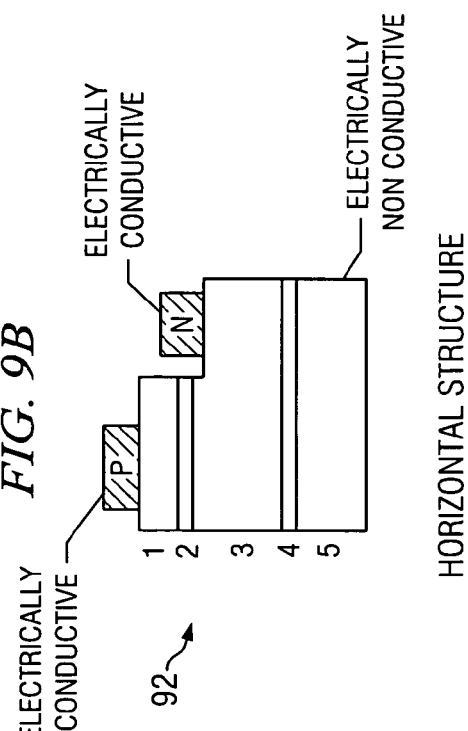

FIG. 8 shows one alternate embodiment 80 of a device using light source 92 having both bond wires on the top of the light source. This is possible because of the horizontal structure of light source 92 as shown in FIG. 9B. In this embodiment adhesive (or other bonding agent) 802 can be both heat conductive as well as electrically conductive. This then allows for the use of solder as the bonding agent which could, in some situations, be more effective than simply being heat conductive.

Figure 9A:
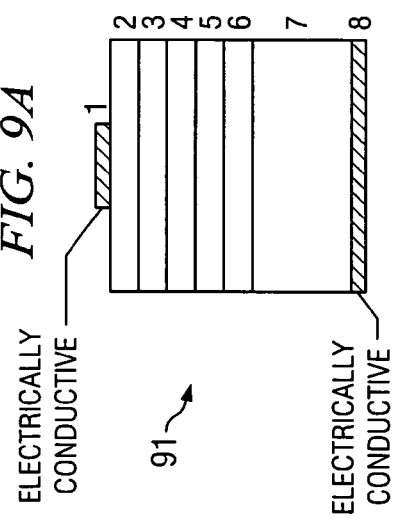

FIG. 9A shows a diagram of vertical structure light source 91 having its electrical connections at the top and at the bottom of the device.

FIG. 9B shows a diagram of horizontal structure light source 92 having both its electrical connections at the top of the device. Note that while only two electrical connections are shown, any number can be used and the concepts discussed herein could work with conductors coming from the sides of the device if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An LED assembly comprising:
a heat-sink pad;
a PCB substrate having a first major surface mated to said heat-sink pad;
an LED mounted at least partially inside an opening located on said PCB substrate and having a portion of said LED physically bonded to the heat sink pad thereby forming a heat dissipation path between said LED and said heat-sink pad; and
a first contact strip located on a second major surface opposing said first major surface of said PCB substrate, said first contact strip electrically connected to said LED for providing an electrical path that is separate from said heat dissipation path, thereby optimizing heat dissipation in said LED assembly.

2. The assembly of claim 1 wherein said opening located on said PCB substrate is configured as a reflector cup for reflecting light generated by said LED positioned within said reflector cup.

3. The assembly of claim 2 wherein said portion of said LED in contact with said heat-sink pad is a portion designed for the dissipation of heat from said LED.

4. The assembly of claim 2 further comprising:
an optical dome covering said LED and said reflector cup.

5. A method of constructing an LED array, said method comprising:
providing a mounting plate on which is mounted a first heat sink pad:
mating to said first heat sink pad, a bottom surface of a first PCB substrate;
providing in said first PCB substrate a reflector area for mounting a first LED therein, said reflector area containing a heat transfer material in contact with the first heat sink pad;
providing on a top surface of said first PCB substrate a first contact pad for connecting with an electrical contact of said first LED; and
positioning said first LED within said reflector area with a bottom surface of said LED in contact with said heat transfer material thereby providing a first heat dissipation path that is separate from an electrical path provided by the first contact pad.

6. The method of claim 5 further comprising:
positioning a first light dome over said reflector area in said first PCB substrate to disperse light from said first LED.

7. An array of LEDs, the array comprising:
a heat dissipation bar;
a first LED assembly mounted on said heat dissipation bar; and
a second LED assembly mounted on said heat dissipation bar, wherein each of said first and second LED assemblies comprises:
a heat-sink pad, said heat-sink pad mounted on to said heat dissipation bar;
a PCB substrate having a first major surface mated to said heat-sink pad;
an LED mounted at least partially inside an opening located on said PCB substrate and having a portion of said LED physically bonded to the heat sink pad thereby forming a heat dissipation path between said LED and said heat-sink pad; and
a first contact strip located on a second major surface opposing said first major surface of said PCB substrate, said first contact strip electrically connected to said LED for providing an electrical path that is separate from said heat dissipation path, thereby optimizing heat dissipation in said array of LEDs.

8. The of claim 7 further comprising:
a back mounting plate to which is attached said heat dissipation bar.

9. The array of claim 8, further comprising:
a cover disposed over said first and second LED assemblies thereby allowing LED light to be visible externally.

10. The array of claim 9, further comprising:
a light diffuser for diffusing LED light generated by at least one of said first and second LED assemblies.

11. The method of claim 5, further comprising:
mounting on said mounting plate, a second heat sink pad;
mating to said second heat sink pad, a bottom surface of a second PCB substrate;
providing in said second PCB substrate a reflector area for mounting a second LED therein, said reflector area containing a heat transfer material in contact with the second heat sink pad;
providing on a top surface of said second PCB substrate a second contact pad for connecting with an electrical contact of said second LED; and
positioning said second LED within said reflector area with a bottom surface of said LED in contact with said heat transfer material thereby providing a second heat dissipation path that is separate from an electrical path provided by the second contact pad.

12. The method of claim 11, further comprising:
positioning a second light dome over said reflector area in said second PCB substrate to disperse light from said second LED.

* * * * *

UNITED STATES PATENT AND TRADEMARK OFFICE
CERTIFICATE OF CORRECTION

| | |
|---|---|
| PATENT NO. | : 7,262,438 B2 |
| APPLICATION NO. | : 11/075094 |
| DATED | : August 28, 2007 |
| INVENTOR(S) | : Thye Mok et al. |

It is certified that error appears in the above-identified patent and that said Letters Patent is hereby corrected as shown below:

Col. 3 Line 57 In Claim 5, delete "pad:" and insert -- pad; --, therefor.

Col. 4 Line 33 In Claim 8, after "The" insert -- array --.

Col. 4 Line 33 In Claim 8, delete "7" and insert -- 7, --, therefor.

Signed and Sealed this

Twenty-fourth Day of February, 2009

JOHN DOLL
*Acting Director of the United States Patent and Trademark Office*